(12) United States Patent
Shimizu et al.

(10) Patent No.: US 6,356,693 B1
(45) Date of Patent: Mar. 12, 2002

(54) SEMICONDUCTOR OPTICAL PULSE COMPRESSION WAVEGUIDE

(75) Inventors: Mitsuaki Shimizu, 403-304, Matsushiro 4-chome, Tsukuba-shi, Ibaraki 305-0035 (JP); Yoshihiro Suzuki, Tsukuba (JP)

(73) Assignees: Secretary of Agency of Industrial Science and Technology, Tokyo; Mitsuaki Shimizu, Tsukuba, both of (JP)

( * ) Notice: Subject to any disclaimer, the term of this patent is extended or adjusted under 35 U.S.C. 154(b) by 0 days.

(21) Appl. No.: 09/523,617

(22) Filed: Mar. 13, 2000

(30) Foreign Application Priority Data

May 26, 1999 (JP) .......................................... 11-147170

(51) Int. Cl.⁷ .............................. G02B 6/10; H01S 3/18
(52) U.S. Cl. .............................. 385/131; 385/14; 385/1; 385/2; 385/129; 385/130; 372/11; 372/43; 372/50
(58) Field of Search ............................ 385/14, 1, 2, 3, 385/129, 130, 131, 122; 372/10, 11, 18, 21, 43, 44, 50, 45, 46

(56) References Cited

U.S. PATENT DOCUMENTS

| | | | | |
|---|---|---|---|---|
| 5,522,005 A | * | 5/1996 | Moretti et al. | 385/129 |
| 5,802,084 A | * | 9/1998 | Bowers et al. | 372/18 |
| 5,901,258 A | * | 5/1999 | Nuang | 385/2 |
| 5,926,585 A | * | 7/1999 | Irikawa et al. | 385/14 |
| 6,081,361 A | * | 6/2000 | Adams et al. | 385/14 X |

FOREIGN PATENT DOCUMENTS

| | | | |
|---|---|---|---|
| JP | 5-95152 | 4/1963 | 385/122 X |
| JP | 5-75212 | 3/1993 | 385/122 X |

OTHER PUBLICATIONS

Yong Lee, Pulse Compression Using Coupled–Waveguide Structures as Highly Dispersive Elements, Applied Physics Letters, vol. 73, No. 19, Nov. 19, 1998, pp. 2715–2717.

Paul A. Morton et al., Dynamic Detuning in Actively Mode–Locked Semiconductor Lasers, IEEE Journal of Quantum Electronics, vol. 25, No. 12, Dec. 1989, pp. 2621–2633.

Yuji Oki, et al., Tunable Ultrashort Pulse Generation from a Waveguide Laser with Premixed–Dye–Doped Plastic Film, Jpn. J. Appl. Phys. vol. 37, Part 1, No. 12A, Dec. 1998, pp. 6403–6407.

Johnson Teng Ong et al., Subpicosecond Soliton Compression of Gain Switched Diode Laser Pulses Using an Erbium–Doped Fiber Amplifier, IEEE Journal of Quantum Electronics, vol. 29, No. 6, Jun. 1993, pp. 1701–1707.

* cited by examiner

*Primary Examiner*—Brian Healy
(74) *Attorney, Agent, or Firm*—Workman, Nydegger & Seeley

(57) ABSTRACT

A semiconductor optical pulse compression waveguide with a novel structure that can greatly reduce its size, and be simply fabricated. The semiconductor optical pulse compression waveguide is composed of a semiconductor optical waveguide which guides an optical signal and includes an optical pulse compression region. The optical pulse compression region includes at least one saturable amplifier region that loses its amplification characteristic after amplifying a fixed amount of optical energy, and at least one saturable absorber region that loses its absorption characteristic after absorbing a fixed amount of optical energy, where the saturable amplifier region and the saturable absorber region are disposed alternately in series in the optical pulse compression region.

5 Claims, 6 Drawing Sheets

SEMICONDUCTOR OPTICAL PULSE COMPRESSION WAVEGUIDE

This application is based on Patent Application No. 11-147170 (1999) filed May 26, 1999 in Japan, the content of which is incorporated hereinto by reference.

BACKGROUND OF THE INVENTION

1. Field of the Invention

The present invention relates to a semiconductor optical pulse compression waveguide for compressing optical pulses to generate narrower width optical pulses applicable for optical communication, optical memory, optical measurement and the like, and more particularly to a technique for transforming originally narrow width optical pulses, which are output from a Q-switched semiconductor laser, gain-switched semiconductor laser or mode-locked semiconductor laser, to ultrashort optical pulses.

2. Description of the Prior Art

Conventionally, several methods have been proposed and available as optical pulse compression technique. A first one of them utilizes nonlinearity of an optical fiber (see, Reference 1; J. T. Ong, R. Takahashi, M. Tsuchiya, S. H. Wong, R. T. Sahara, Y. Ogawa and T. Kamiya, "Subpicosecond Soliton Compression of Gain Switched Diode Laser Pulses Using an Erbium-Doped Fiber Amplifier", IEEE Journal of Quantum Electronics, Vol. 29, No. 6, June 1993, and the like). The nonlinearity of the optical fiber utilized in this method refers to such features as optical group velocity dispersion in the optical fiber and optical intensity dependence of the refractive index of a material constituting the optical fiber.

The optical group velocity dispersion refers to a property of varying optical group velocity in a material. Utilizing this property can shorten the width of the optical pulses in chirping, for example, where chirping refers to a phenomenon in which the wavelength of an optical pulse varies from its front to rear portion.

More specifically, consider an optical fiber with smaller group velocity for the front wavelength and greater group velocity for the rear wavelength, in which case optical pulses can have a shorter front wavelength and a longer rear wavelength. During the propagation of these optical pulses through the optical fiber, the rear portions of the optical pulses gradually catch up with the front portions because of the greater rear group velocity, resulting in gradual reduction in the width of the optical pulses. Thus, the optical pulses with such a property, chirping, can be compressed during the propagation through the optical fiber.

Alternatively, it is also possible to utilize the optical intensity dependence of refractive index of the material constituting the optical fiber. This method utilizes the difference in the refractive index for the intensity of light. Using this effect (optical intensity dependence of refractive index) can narrow or widen, or change the pulse width by selecting conditions during the propagation of the optical pulses through a fiber. The effect generally grow stronger with an increase in the energy of the optical pulses. Taking account of this, an actual system amplifies the optical pulse energy by passing through an erbium-doped fiber amplifier or the like, followed by the compression of the optical pulses through an optical fiber.

A second method relates to an optical waveguide pulse compression device utilizing the group velocity dispersion in a waveguide. It also uses the wavelength dependence of the optical group velocity as the foregoing method utilizing the optical fiber.

The waveguide is fabricated using a dielectric or a semiconductor. The mechanism for compressing optical pulses utilizing the group velocity dispersion of a waveguide is principally the same as the method utilizing the group velocity dispersion in the optical fiber (see, Reference 2; Y. Lee, "Pulse compression using coupled-waveguide structures as highly dispersive elements", Applied Physics Letters, Vol. 73, No. 19, November 1998 and the like). However, the waveguide using the semiconductor or dielectric has a higher degree of flexibility in the designing for its fabrication. Thus, taking advantage of this feature with devising the structure of the waveguide can increase the variations in the group velocity associated with the changes in the wavelength. The length of the pulse compression device can be reduced, as well. For example, the length from several tens of meters to hundreds of meters required for the optical fiber can be reduced to a few millimeters to centimeters by using the waveguide.

All the foregoing conventional methods mainly utilize the property that the wavelength of the optical pulses varies from the front portion to the rear portion, that is, chirping. A more important thing is that the manner of the chirping must well match the dispersion characteristic of the optical fiber or of the optical waveguide. Although the wavelength varies in the optical pulses, sufficient effect cannot be achieved if the manner of the variations in the wavelength does not match the characteristic of the group velocity dispersion of the optical fiber. For example, the optical pulses having a short wavelength at their front portion, long wavelength at their central regions and again short wavelength at their final regions cannot cause the pulse compression substantially, and hence cannot be utilized. Furthermore, these conventional methods are inapplicable to the compression of wide optical pulses without chirping.

From a practical point of view, it is strongly desired that the components used for the pulse compression are small in size. However, the optical fiber used for the pulse compression is hundreds of meters to several kilometers long, occupying a large space. In addition, the optical amplification carried out by the erbium-doped fiber in advance requires an erbium-doped fiber, a light source for exciting the erbium-doped fiber, a coupler for interconnecting the fibers and the like, which inevitably increases the size of the entire system, and presents a great drawback to actual use. In addition, it is necessary for achieving the desired pulse compression to adjust the length of the fiber in accordance with the chirping, which limits a degree of flexibility in designing, fettering the application to commercial systems.

Although the conventional optical waveguide pulse compression device can be made much smaller than the compression system using the optical fiber, it is not small enough to meet the requirement of practical systems. Practical systems usually employ as their optical pulse source a gain-switched semiconductor laser or Q-switched semiconductor laser light source. The width of the optical pulses generated by these semiconductor lasers are about 10 ps wide, and the conventional optical waveguide pulse compression device requires a waveguide of a few centimeter long to compress the optical pulses on the order of 10 ps wide. In addition, the structure of the conventional optical waveguide pulse compression device greatly differs from that of the conventional semiconductor laser (see, Reference 2; Y. Lee, "Pulse compression using coupled-waveguide structures as highly dispersive elements", Applied Physics Letters, Vol. 73, No. 19, November 1998 and the like). Thus, to integrate the conventional optical waveguide pulse compression device into the same semiconductor substrate as the Q-switched semiconductor laser or gain-switched semiconductor laser, a complicated process is required, presenting a problem to implement practical systems.

SUMMARY OF THE INVENTION

Therefore, an object of the present invention is to provide a semiconductor optical pulse compression waveguide with a novel structure that can greatly reduce its size as compared with the conventional optical pulse compression system, and that can simplify its fabrication, and particularly, to provide a semiconductor optical pulse compression waveguide with a novel structure that can be easily integrated into the same semiconductor substrate as a Q-switched semiconductor laser or gain-switched semiconductor laser used as an optical pulse light source, and that can be manufactured without using a complex fabrication process.

Another object of the present invention is to provide a novel structure semiconductor optical pulse generating laser with an optical pulse compression waveguide that can integrate into the same substrate the semiconductor optical pulse compression waveguide and one of various types of semiconductor lasers serving an optical pulse light source, thereby obtaining ultrashort optical pulses.

The inventors of the present invention accomplished the present invention as a result of intensive research into an optical pulse compression method based on a new operation principle, and into a component structure for realizing the operation principle, in which they found that the pulse width can be reduced step by step by passing optical pulses alternately through a saturable absorber and a gain region.

According to the present invention, there is provided a semiconductor optical pulse compression waveguide composed of a semiconductor optical waveguide that guides an optical signal and includes an optical pulse compression region, the optical pulse compression region comprising: at least one saturable amplifier region that loses its amplification characteristic after amplifying a fixed amount of optical energy; and at least one saturable absorber region that loses its absorption characteristic after absorbing a fixed amount of optical energy, wherein the at least one saturable amplifier region and the at least one saturable absorber region are disposed alternately in series in the optical compression region.

The semiconductor optical pulse compression waveguide can compress the width of the optical pulse injected from the outside while the optical pulse passes through the optical pulse compression region in the course of traveling through the optical waveguide.

The semiconductor optical pulse compression waveguide may further comprise a first light modulation region disposed between an optical pulse inlet, through which the optical signal is injected into the optical waveguide, and the optical pulse compression region, for regulating energy of an optical pulse. Alternatively, it may further comprise a second light modulation region disposed between the optical pulse compression region and an optical pulse outlet, through which the optical signal is extracted from the optical waveguide, for regulating energy of an optical pulse. Furthermore, it may comprise both the optical pulse outlet side light modulation region and the optical pulse inlet side light modulation region.

According to the present invention, the semiconductor optical pulse compression waveguide can be combined with a semiconductor laser serving as a pulse light source to implement a device for generating ultrashort pulses. In particular, it is preferable that the semiconductor laser be integrated with the semiconductor optical pulse compression waveguide on the same semiconductor substrate.

According to the present invention, a semiconductor optical pulse generating laser with the optical pulse compression waveguide can be implemented by combining the semiconductor optical pulse compression waveguide with a semiconductor laser capable of generating optical pulses using such a technique as Q-switching, gain switching and mode locking. In other words, the semiconductor laser can comprise in its resonator the foregoing semiconductor optical pulse compression waveguide structure, and generate optical pulses using the technique such as Q-switching, gain switching and mode locking.

More specifically, the semiconductor laser can comprise to generate optical pulses a semiconductor laser region for generating optical pulses using such a technique as Q-switching, gain switching and mode locking, and a semiconductor optical pulse compression waveguide region in accordance with the present invention with the foregoing structure, which is disposed in series on an extension of the resonator of the laser, wherein the optical pulses generated by the semiconductor laser region is output after passing through the semiconductor optical pulse compression waveguide region. It is preferable that the semiconductor laser region and the semiconductor optical pulse compression waveguide region share the waveguide structure with each other, in which they are integrated in the same semiconductor substrate.

According to the present invention, the semiconductor optical pulse compression waveguide has an advantage of being able to compress the optical pulses without increasing the device length so much because it compresses the optical pulses step by step by iterating partial optical absorption and re-amplification using the alternately disposed saturable absorption regions and gain regions. In addition, it offers a practical advantage of being able to compress the optical pulses independently of wavelength distribution or fluctuations in the optical pulses, or of the presence or absence of the chirping. Furthermore, because its structure such as the layer structure of the optical pulse compression waveguide can be substantially the same as that of the semiconductor laser, the optical pulse compression waveguide and the semiconductor laser used as the light source can be integrated into the same substrate, simplifying the fabrication process. Moreover, taking advantage of being able to integrate into the same substrate, it is not difficult to implement a semiconductor optical pulse generating laser with the optical pulse compression waveguide, in which the optical pulse compression waveguide structure is disposed in the resonator of the semiconductor laser acting as the light source. The semiconductor optical pulse generating laser with such a structure is suitable for generating ultrashort optical pulses.

The above and other objects, effects, features and advantages of the present invention will become more apparent from the following description of embodiments thereof taken in conjunction with the accompanying drawings.

DESCRIPTION OF THE PREFERRED EMBODIMENTS

The structure and operation principle of the semiconductor optical pulse compression waveguide in accordance with the present invention will now be described in more detail.

Figure 1:
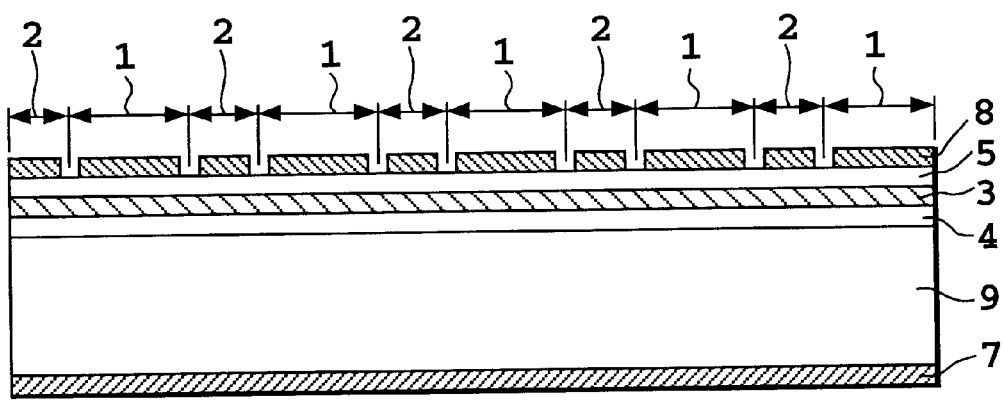
FIG. 1 is cross-sectional view showing a basic structure of a semiconductor optical pulse compression waveguide in accordance with the present invention.

The semiconductor optical pulse compression waveguide in accordance with the present invention compresses the width of optical pulses using a semiconductor optical waveguide with a structure including gain regions and saturable absorption regions (saturable absorber) disposed alternately. FIG. 1 shows a concrete example of such a structure. The optical waveguide comprises an optical waveguide layer (active region) 3, a p-type cladding layer 5 and an n-type cladding layer 4 used for optical confinement. The optical waveguide further comprises on its top surface electrodes 8 for applying a voltage to the pn junction. As shown in FIG. 1, gain regions 1 and saturable absorption regions 2 are disposed alternately in the waveguide direction under the electrodes 8.

The gain regions 1 are regions for providing a gain by a current injected into the pn-junction active region 3. The gain regions 1 are also referred to as a saturable gain region because they temporarily lose their gain when amplifying a fixed amount or more optical energy in response to a current quantity. In other words, the gain is temporarily lost in conjunction with the carrier exhaustion in the active region (active layer) 3.

On the other hand, the saturable absorption regions (saturable absorbers) 2 can be formed by a few methods. For example, they are formed by providing them with an absorption characteristic by applying a negative voltage to the electrodes 8 for reversely biasing the pn-junction to make them depletion regions; or by providing them with an absorption characteristic by depleting carries (making semi-insulated) by injecting into the regions ions accelerated in a vacuum under a high voltage. The saturable absorbers 2 are called thus because they have such a characteristic as temporarily stopping absorption once they have absorbed a fixed amount of optical energy. In other words, there arises a transitional reduction in absorption (optical bleaching) with an increase in the carrier density in the active region (active layer) 3 caused by optical absorption.

The semiconductor optical pulse compression waveguide in accordance with the present invention comprises in its optical pulse compression region one or more pairs of the saturable absorption regions (saturable absorbers) 2 and the saturable gain regions 1, which are disposed alternately in this order in the propagation direction of the optical pulses. To achieve a high pulse compression ratio, at least two pairs, preferably multiple pairs of them are disposed.

Since the gain regions 1 carry out the optical amplification by the stimulated emission, the layer structure of the active region 3 and the optical waveguide layer composed of the p-cladding layer 5 and n-cladding layer 4 used for optical confinement is substantially the same as the layer structure of the corresponding semiconductor laser. Likewise, since the saturable absorption regions 2 absorb the light with the wavelength causing the stimulated emission in the gain regions 1, their optical waveguide layer structure is substantially the same as the layer structure of the corresponding semiconductor laser. In contrast with the semiconductor laser, however, since the semiconductor optical pulse compression waveguide in accordance with the present invention does not require any resonator, but rather must introduce the optical pulses effectively into the waveguide and emit the optical pulses compressed therein effectively, it reduces the reflectivity of its end faces constituting the optical pulse inlet and outlet. Thus, the end face of at least the optical pulse outlet is usually covered with antireflection coating.

Next, the pulse compression process will be described when an optical pulse passes through the semiconductor optical waveguide device with such a structure. The pulse compression process under actual condition in which the device operates depends greatly not only on the current amount fed to the gain regions 1 and on the reverse bias voltage applied to the saturable absorbers 2, but also on the waveform of the optical pulse injected into the optical waveguide, complicating the compression process. For the sake of simplicity, the pulse compression process will be described assuming ideal operation conditions.

Thus, it is assumed in the following description of the operation principle that the absorption amount of the saturable absorbers 2 is determined by the reverse bias voltage applied, and the gain of th gain regions 1 is determined by the current amount injected, and that the energy of the optical pulse incident onto the optical waveguide is adjusted in advance. More specifically, the energy of the optical pulse (light intensity) is assumed to be adjusted such that only the front half of the optical pulse is absorbed by each of the saturable absorbers 2. At the same time, the reverse bias voltage applied to the saturable absorbers 2 is adjusted such that the saturable absorption regions 2 will saturate when they absorb the energy (light) corresponding to the front half of the injected optical pulse. On the other hand, the current amount supplied to the gain regions 1 is adjusted such that their gain is temporarily lost when they amplify the energy (light) corresponding to the front half of the injected optical pulse.

Under these operation conditions, an optical pulse launched into the optical waveguide undergoes the absorption of only its front portion in the course of passing through one of the saturable absorbers 2. As a result, the front half of the pulse is lost, resulting in approximately halving the pulse width. Subsequently, when the optical pulse passes through one of the gain regions 1, it undergoes the optical amplification by the amount of energy (light) corresponding to the front half of the pulse, thereby recovering the total energy (light) of the initial incident optical pulse. The amplification process does not much spread the pulse width, and recovers the total energy (light) with nearly maintaining the original pulse waveform. Accordingly, when passing through the gain region, a transformed (compressed) optical pulse is generated whose pulse width is about half that of the initial incident optical pulse, and whose total energy (light) is nearly the same as that of the initial incident optical pulse. In other word, the optical pulse is obtained whose pulse width is narrower and whose peak intensity is greater than those of the pulse before entering the saturable absorber 2.

Subsequently, by passing the obtained optical pulse through the next saturable absorber 2, the front portion of the optical pulse is absorbed, further narrowing the pulse width. In the course of passing through the next gain region 1, the energy (light) corresponding to the amount of energy absorbed by the saturable absorber 2 is amplified, recovering the total energy (light) of the pulse. In this way, the optical pulse is obtained whose pulse width is further narrowed and whose peak intensity is further increased. As described above, the saturable absorbers 2 function to narrow the pulse width, and the gain regions 1 serve to recover the total energy (light) attenuated by the absorption. If the gain regions 1 carry out insufficient amplification, and the subsequent saturable absorbers 2 continue absorbing, the optical pulse will be extinguished. To prevent this, and to continue step by step pulse compression effectively, the gain regions 1 are disposed at individual stages to carry out amplification for compensating for the absorption by the saturable absorbers 2.

Thus, passing the optical pulse through the pairs of the saturable absorbers 2 and the gain regions 1 disposed alternately in this order can narrow the pulse width step by step. This can implement a semiconductor optical pulse compression waveguide capable of effectively compressing the optical pulses by introducing them and passing them through the optical pulse compression region composed of the saturable absorption regions 2 and the gain regions 1 alternately disposed in series.

Figure 2:
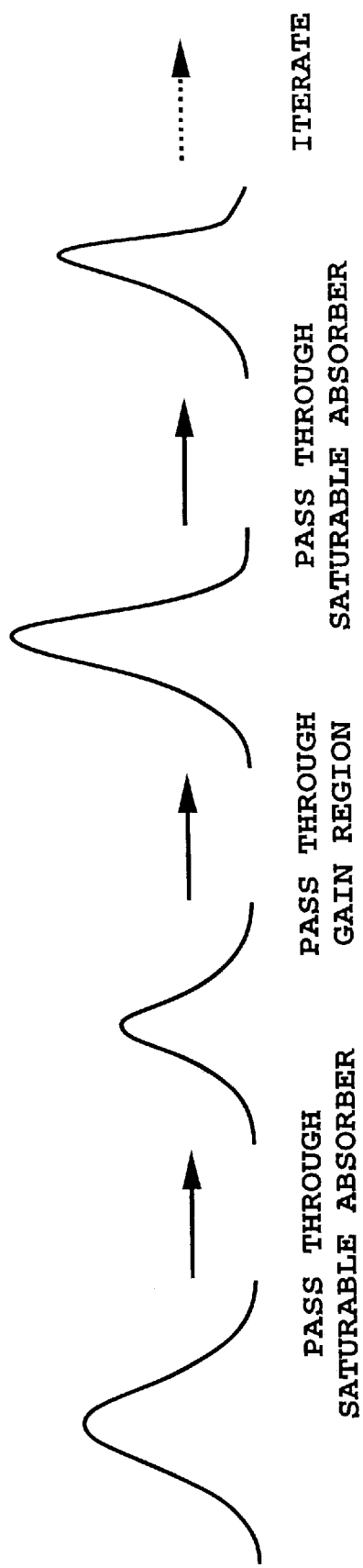
FIG. 2 is a schematic diagram illustrating a process in which the semiconductor optical pulse compression waveguide in accordance with the present invention compresses an optical pulse.

FIG. 2 is a schematic diagram illustrating the transform of the waveform of the optical pulse during the pulse compression by an actual device based on the foregoing operation principle of the pulse compression. When the pulse passes through the saturable absorber 2, its front portion is absorbed, and this will narrow the pulse width. In an ideal case in which the saturable absorber 2 saturates instantaneously, the pulse width will be halved. However, the actual device can narrow the pulse width only by a few to 40%. The pulse passes through the gain region 1, next. It amplifies approximately twice the energy of the optical pulse that is subjected to the absorption and attenuated, thereby recovering the initial pulse energy. When it passes through the next saturable absorber 2, the front portion of the pulse is absorbed, and the pulse width is further compressed. The pulse energy which is nearly halved is also amplified twice by the gain region 1 to recover the energy. Iterating the operation can achieve the pulse compression step by step.

It is important for the compression efficiency that the peak intensity of the optical pulse increases in the pulse compression process. Generally speaking, the saturable absorbers 2 saturate more instantaneously (rapidly) as the peak intensity of the incident optical pulse increases. Reversely, as the peak intensity reduces, the saturable absorbers 2 saturate slowly. Therefore, the pulse compression effect improves as the peak intensity of the optical pulse increases. Although the compression ratio will be low in initial stages when the peak intensity of the initial pulse is small, the peak intensity will increase step by step as the pulse width is compressed while passing through the multistage saturable absorbers 2 and gain regions 1. Thus, the semiconductor optical pulse compression waveguide in accordance with the present invention can increasingly narrow the pulse width through the structure disposing the saturable absorbers 2 and gain regions 1 in multistage fashion. The increasing pulse compression effect relates to in what manner the absorption characteristic of the saturable absorption regions 2 depends on the carrier density in the active region 3, and in what manner the gain characteristic of the gain regions 1 depend on the carrier density in the active region 3. This deeply depends on the property of the semiconductor material and the structure of the device, and also relates to the operation condition. More specifically, it relates to the reverse bias voltage applied to the saturable absorption regions 2 and the current amount injected into the gain regions 1.

Since the semiconductor optical pulse compression waveguide in accordance with the present invention is based on the foregoing operation principle, it can compress the optical pulse without increasing the device length so much. This is because the pulse compression process in the individual stages can be implemented by absorbing the front portion of the optical pulse. Ideally, each time the pulse passes through the saturable absorber 2, the pulse width is halved. In practice, however, since the shape of the initial pulse is not necessarily symmetrical, and the sudden absorption saturation does not take place unless the peak intensity of the optical pulse is large enough, it is not rare that the pulse width is not halved. However, each time the pulse passes through the saturable absorber 2 and the gain region 1, the pulse width reduces at about a fixed ratio, the peak intensity increases at about a fixed ratio, and thus the pulse width is narrowed exponentially. As a result, it is unnecessary to lengthen the device length so much. For example, the device with the total length of about 1–2 mm or less can compress the optical pulse of 5–10 ps wide to a pulse of less than 1ps wide.

Furthermore, even if the pulse is very wide, the pulse compression can be carried out effectively if the peak intensity of the optical pulse is large. This enables the semiconductor optical pulse compression waveguide to compress the optical pulse of several tens of picoseconds wide by increasing the peak intensity of the optical pulse before it reaches the optical pulse compression waveguide region by providing an optical amplifier between the optical pulse inlet and the optical pulse compression waveguide region. In contrast, if the intensity of the incident optical pulse is so large that the saturable absorber cannot absorb half the light amount, an optical attenuator provided between the optical pulse inlet and the optical pulse compression waveguide region can adjust the light amount of the optical pulse before supplied to the optical pulse compression waveguide region, thereby enabling the effective pulse compression. In other words, an optical modulation region, which is provided between the optical pulse inlet and the optical pulse compression region for amplifying or attenuating the light intensity (energy) of the optical pulse before introduced into the optical pulse compression waveguide region in order to match the light intensity to the operation condition, enables more effective optical pulse compression independently of the shape or intensity of the optical pulse injected.

The optical pulse compression using the semiconductor optical pulse compression waveguide in accordance with the present invention increases the peak intensity of the optical pulse step by step as the pulse compression progresses. Accordingly, the peak intensity of the optical pulse output from the device can be increased to an unintended level. In other cases, the optical modulation region, which is provided just after the optical pulse inlet to amplify (or attenuate) the input pulse in advance to match its level to the optical pulse compression, can increase (or decrease) the total light amount (energy) of the optical pulse output from the device to an unintended level. To solve such a trouble with the optical pulse intensity caused by (involved in) the optical pulse compression, another light- modulation region can be provided between the optical pulse compression region and the optical pulse outlet in order to attenuate or amplify the optical pulse intensity to a desired level.

Thus providing both the optical pulse inlet side and the optical pulse outlet side with the light modulation regions having different functions makes it possible to achieve more efficient optical pulse compression independently of the shape and intensity of the incident optical pulse, and simultaneously to adjust the peak intensity and total intensity of the optical pulse compressed and output from the device to desired levels. In other words, more efficient optical pulse compression can be achieved by selecting optimum operation conditions of the optical pulse compression region, by carrying out intensity modulation (amplification or attenuation) of the optical pulse to be introduced into the optical pulse compression region in order to match the intensity to the operation conditions, and by carrying out re-intensity modulation (attenuation or amplification) of the optical pulse intensity after the pulse compression in order to match the intensity to a subsequent purpose.

Furthermore, since the semiconductor optical pulse compression waveguide in accordance with the present invention has basically the same layer structure and cross-sectional shape as the semiconductor laser, it is easy to integrate the semiconductor optical pulse compression waveguide into the same substrate as the semiconductor laser operating as the pulse light source. More specifically, in the semiconductor optical pulse compression waveguide in accordance with the present invention, the active layer and cladding layers in the waveguide for confining the optical signal are substantially the same as those of the semiconductor laser, and the lateral optical confinement by the refractive index guiding type structure is commonly used in semiconductor lasers. These common semiconductor layer structure and the waveguide cross-sectional shape can be easily integrated into and built on the same substrate. Furthermore, it is possible to narrow the width of the directly output optical pulses by integrating the semiconductor optical pulse compression waveguide region into the Q-switched semiconductor laser or gain-switched semiconductor laser capable of generating the optical pulses, making it possible to form a semiconductor laser with the optical pulse compression waveguide.

Moreover, since the semiconductor optical pulse compression waveguide in accordance with the present invention carries out the pulse compression in the process that iterates the partial absorption and optical amplification using the saturable absorbers 2 and gain regions 1, the pulse compression can be achieved independently of the presence and absence of the wavelength distribution (of the chirping) in the optical pulse. On the contrary, the semiconductor optical pulse compression waveguide is more suitable for the compression of the optical pulses without chirping. In addition, as for the optical pulses with large chirping, the semiconductor optical pulse compression waveguide has a spillover effect for gradually narrowing the effective wavelength distribution in connection with the optical amplification in the gain regions 1, achieving the efficient pulse compression, as well. More specifically, because the optical amplification efficiency of the gain regions 1 has a particular, very narrow wavelength distribution, the optical pulse is limited by the very narrow wavelength distribution in the course of iterating the absorption and optical amplification.

Next, the present invention will be described in more detail in connection with an embodiment of the structure, fabrication process steps and pulse compression of the semiconductor optical pulse compression waveguide in accordance with the present invention.

Figure 3:
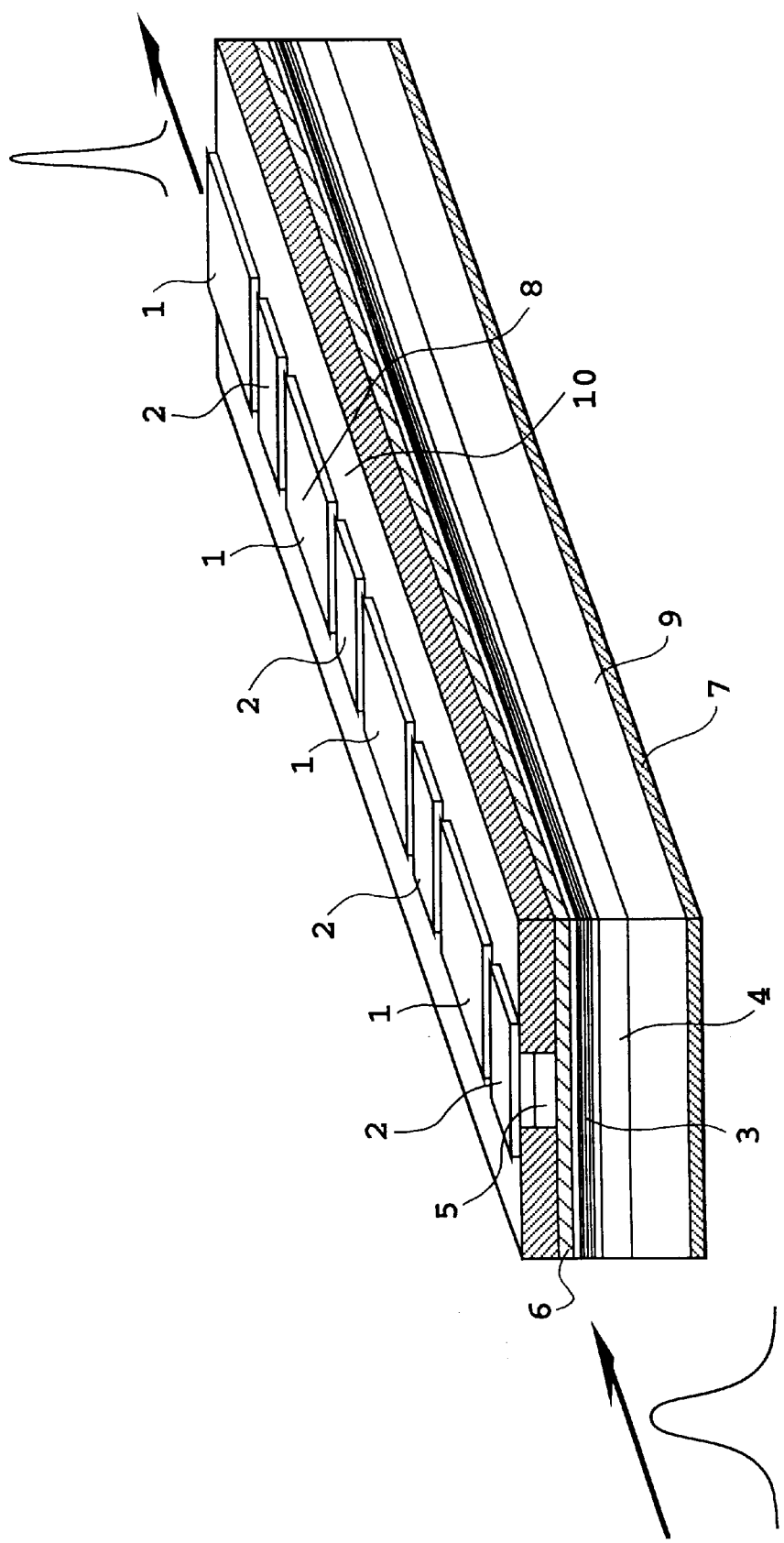
FIG. 3 is a perspective view showing an example of the semiconductor optical pulse compression waveguide structure in accordance with the present invention, that is, a concrete device structure of a semiconductor optical pulse compression waveguide with an active layer of multiple quantum wells consisting of an AlGaAs based material.

FIG. 3 shows an example of the pulse compression waveguide structure of the semiconductor optical pulse compression waveguide in accordance with the present invention. In this example, the waveguide comprises an active region 3 through which an optical signal travels; an n-type cladding layer 4 and a p-type cladding layer 5 for carrying out the optical confinement in the layer direction. The p-type cladding layer 5 is partially left on top of the waveguide with its remaining region removed by etching, thereby forming a refractive index guiding type having differences in the effective refractive index. With regard to the top surface, p-type electrodes 8 are formed on a p-type contact layer, whereas n-type electrode 7 is formed on the bottom surface of an n-type substrate 9, thus constructing a structure for applying a voltage to the pn-junction formed in the active region 3. The pulse compression region comprises saturable absorption regions 2 and gain regions 1, which are formed alternately, and have on their top surfaces the separate p-type electrodes 8 to apply different bias voltages. In this example as shown in FIG. 3, the p-type cladding layer 5 is preserved in the selective etching using a mask, thereby forming the waveguide. An etching stop layer 6 for the waveguide forming process used during the etching process is interposed between the p-type cladding layer 5 and the active region 3. The region on the top surface other than the p-type contact layer left in the etching is covered with an insulating layer 10, which also serves to level the top surface. Since the optical waveguide is a refractive index guiding type, the wavelength distribution of the optical amplification efficiency in the gain regions 1 is narrow so that it can carry out efficient pulse compression not only of the optical pulse without chirping, but also of the optical pulse with chirping.

FIG. 3 also shows composition, structure and thickness of AlGaAs based materials used for the respective components for reference purposes. More specifically, the active region 3 utilizes quantum effect called multiple quantum wells to establish a predetermined band gap. In particular, the present example has a structure called graded-index type multiple quantum wells including multiple quantum wells composed of five pairs of a well layer (GaAs well layer) and a barrier layer (AlGaAs barrier layer). In the active region, effective refractive index profile is created in the up-and-down direction of the multiple quantum well layer. For example, in the up-and-down direction of the multiple quantum well layer, the refractive index is gradually varied by sequentially depositing barrier layers of about 0.1 micron thick whose aluminum composition ratio gradually varies in order to build the refractive index profile suitable for the optical waveguide. The n-type cladding layer 4 consists of $Al_{0.4}Ga_{0.6}As$ of 1.2 µm thick, and the p-type cladding layer 5 consists of $Al_{0.4}Ga_{0.6}As$ of 1.1 µm thick. The etching stop layer 6 consists of $Al_{0.65}Ga_{0.35}As$ of 0.1 µm thick, whose aluminum content is significantly increased as compared with $Al_{0.4}Ga_{0.6}As$ of the p-type cladding layer 5 to provide marked difference in the etching speed between them. Ohmic electrodes are formed as the p-type electrodes 8 on the p-type GaAs layer as the p-type contact layer through heat treatment of metal film consisting of Cr/Au/Zn/Au. The n-GaAs substrate constituting the n-type substrate 9 is polished on its bottom surface to a predetermined thickness, followed by the heat treatment of an AuGe alloy/Au to form an n-type electrode 7 as an ohmic electrode. In this example, antireflection coating is applied to both the optical pulse inlet (front end) and optical pulse outlet (rear end). The example employs, in addition to the refractive index guiding type, the active region consisting of the graded-index type multiple quantum wells. This makes it possible to further increase the optical amplification efficiency in the gain regions 1, and to further quicken the absorption saturation in the saturable absorption regions 2.

The saturable absorbers 2 constituting the pulse compression region are formed by applying a reverse bias, and the gain regions 1 are formed by injecting a current (as a forward bias). The p-type electrodes 8 on the saturable absorption regions 2 and gain regions 1 are separated about 5–10 µm apart from each other. The distance (gap) is provided not only for preventing the two types of the electrodes from contacting (being short-circuited) each other because they are applied with different voltages, but also for preventing the current to be injected to the active region under the gain regions from being laterally diffused and injected into the saturable absorption regions through the p-type cladding layer by separating them sufficiently.

The length of the saturable absorption regions 2 and that of the gain regions 1 can be determined as follows. First, the relation between the width of the incident optical pulse and that of the emitted optical pulse width is numerically analyzed by applying the length of the saturable absorption regions 2 and that of the gain regions 1 used as parameters to travelling wave type rate equations. Second, the lengths are determined such that a desired pulse compression ratio is obtained. The analyzing method based on the travelling wave type rate equations is described in Reference 3; P. A. Morton, R. J. Helkey, and J. E. Bowers, "Dynamic Detuning in Actively Mode-Locked Semiconductor Lasers", IEEE Journal of Quantum Electronics, Vol. 25, No. 12, December 1989 and others.

Figure 4:
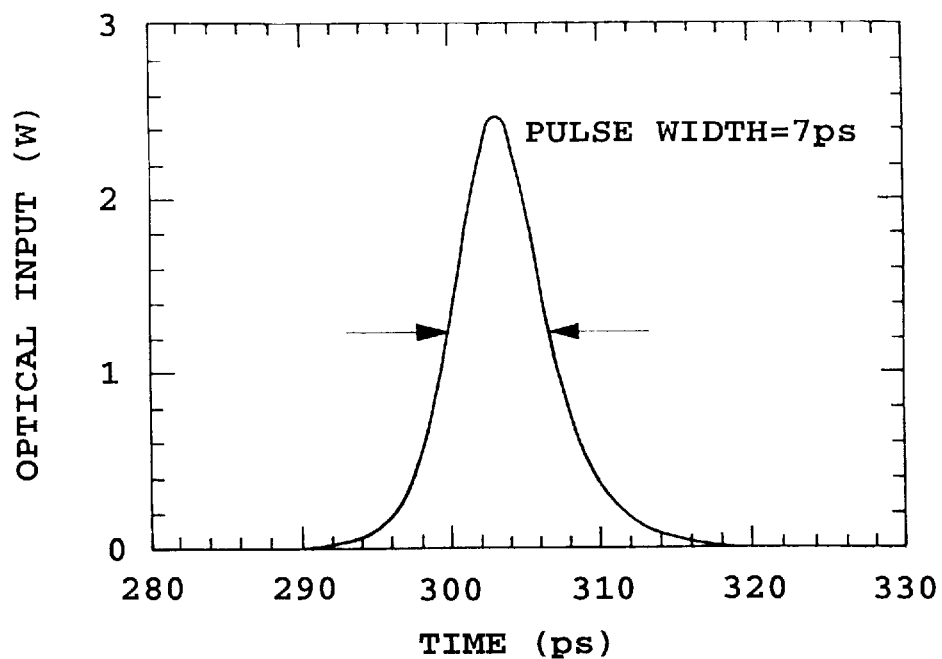
FIG. 4 is a diagram illustrating a waveform of an optical pulse injected into the semiconductor optical pulse compression waveguide.
Figure 5:
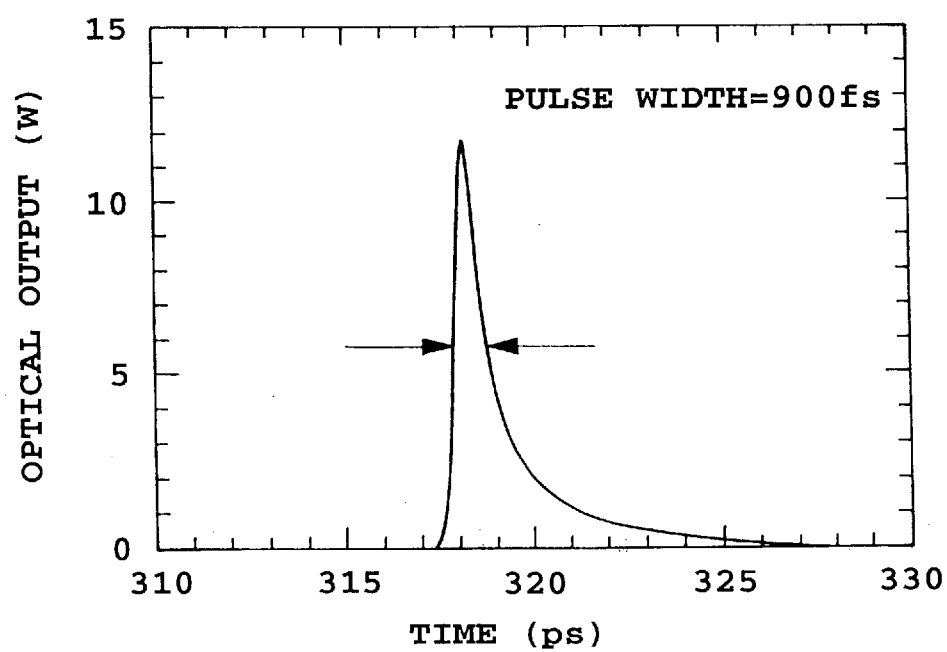
FIG. 5 is a diagram illustrating a waveform of an optical pulse compressed by and emitted from the semiconductor optical pulse compression waveguide, which is estimated by numerical analysis.

A result of the numerical analysis will now be described to show the compression manner of the pulse width in the device structure as shown in FIG. 3, wherein the length of the saturable absorbers 2 is 100 µm and that of the gain regions 1 is 180 µm. FIG. 4 shows the pulse waveform of the incident light assumed in the numerical analysis. The waveform is the same as that of the output optical pulse from a gain switching type semiconductor laser or the like. The incident optical pulse as shown in FIG. 4 is 7 ps wide and asymmetrical, and is input to the semiconductor optical pulse compression waveguide. The pulse waveform of the output light is calculated, and its result is shown in FIG. 5. As shown in FIG. 5, the output light has a pulse waveform with its front portion compressed, its relative asymmetry increased, its peak intensity increased about four times, and its pulse width being reduced to 900 fs. As shown in this example, only a few millimeter long waveguide can easily compress the optical pulse.

Figure 6:
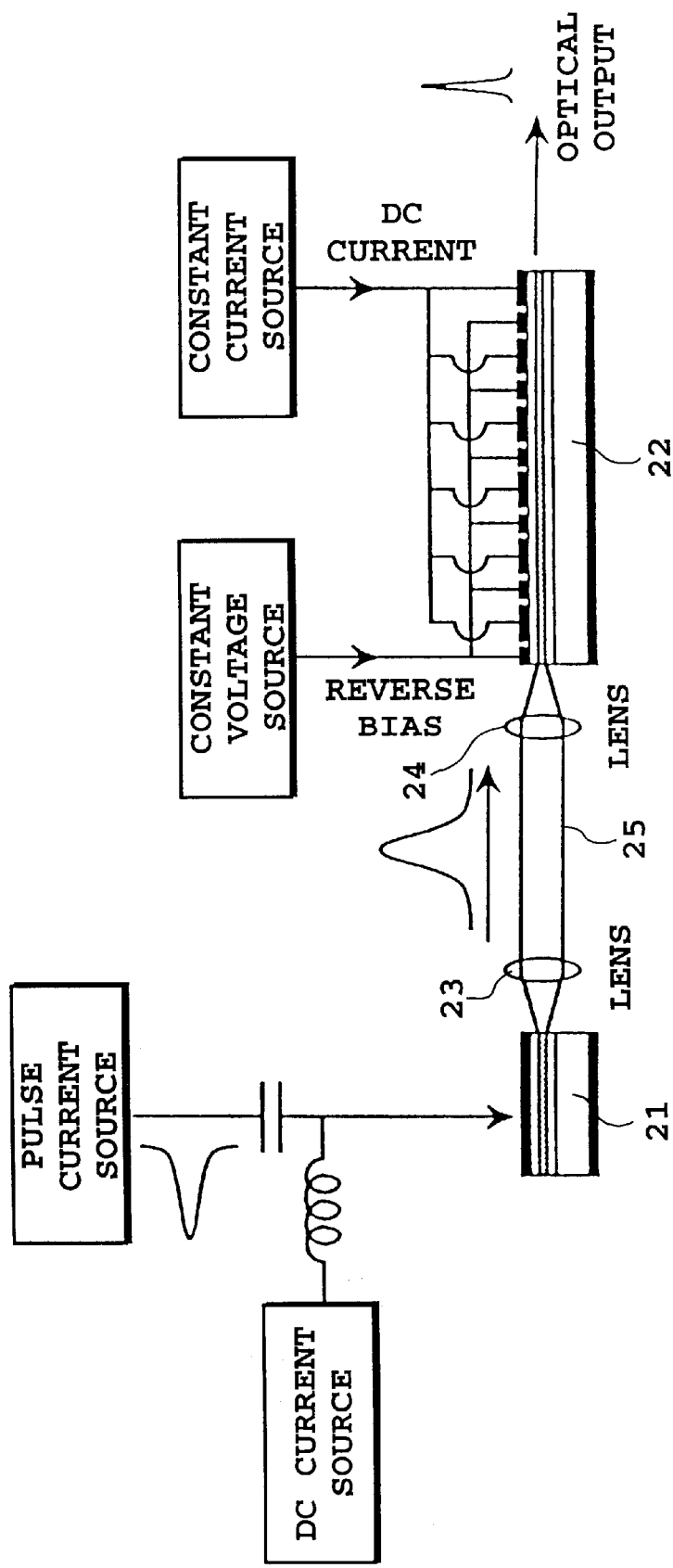
FIG. 6 is a block diagram showing an entire configuration of a device for carrying out optical pulse compression using the semiconductor optical pulse compression waveguide in accordance with the present invention.

FIG. 6 is a schematic diagram showing an entire configuration of a system, in which the semiconductor optical pulse compression waveguide in accordance with the present invention carries out the pulse compression of an optical pulse output from an AlGaAs gain-switched semiconductor laser. The optical pulse emitted from the gain-switched semiconductor laser or Q-switched semiconductor laser 21 (AlGaAs multiple quantum well gain switch semiconductor laser with oscillation wavelength of 0.84 micron) is injected into the semiconductor optical pulse compression waveguide 22 (AlGaAs multiple quantum well semiconductor optical pulse compression waveguide) using an optical system including lenses 23,24, fibers 25 and the like. If the optical system including lenses, fibers and the like has large coupling losses between its components, the semiconductor optical pulse compression waveguide 22 is employed which comprises immediately after the inlet the optical amplifier region (gain region) followed by the semiconductor optical pulse compression waveguide region. The optical amplifier region (gain region) can compensate for the loss which the optical pulse emitted from the gain-switched semiconductor laser or Q-switched semiconductor laser 21 undergoes before the pulse enters the semiconductor optical pulse compression waveguide 22, and regulates the energy of the optical pulse incident to the semiconductor optical pulse compression waveguide region to an appropriate level.

Figure 7:
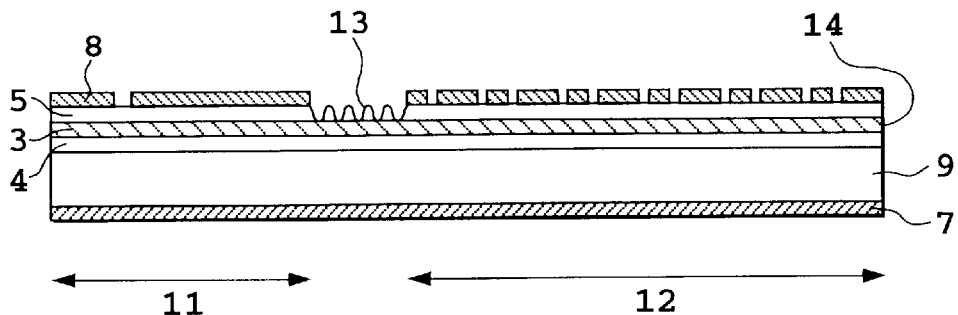
FIG. 7 is a cross-sectional view showing an example comprising a semiconductor laser optical pulse source using a distributed Bragg reflector and the semiconductor optical pulse compression waveguide in accordance with the present invention, both of which are integrated into the same substrate.

FIG. 7 shows a composite device integrating a Q-switched semiconductor laser and the semiconductor optical pulse compression waveguide in accordance with the present invention. In the example as shown in FIG. 7, the resonator of the Q-switched semiconductor laser 11 is composed of a left end face and a distributed Bragg reflector 13. An optical outlet end face 14 at the right side is covered with an antireflection coating so that the end face does not function as an external reflector for the Q-switched semiconductor laser 11. The distributed Bragg reflector 13 functions as a reflector because of the multiple reflection effect caused by a grating structure forming a cyclic refractive index profile. A semiconductor optical pulse compression waveguide 12 is integrated into an extension of the laser resonator, and the optical pulse undergone the pulse compression is emitted from the optical outlet end face 14 (antireflection coating) on the right side. The grating region constituting the distributed Bragg reflector 13 can be formed by patterning the etching mask using conventional semiconductor fine pattern technology such as an interference exposure method and electron beam patterning method, followed by applying a selective etching process. Since the coupling loss is not large between the semiconductor laser and the semiconductor optical pulse compression waveguide in this integration structure, the semiconductor optical pulse compression waveguide itself can take the structure as shown in FIG. 6, which includes no optical amplifier region (gain region) after the inlet. The resonator of the Q-switched semiconductor laser 11 constructed using a distributed Bragg reflector can control the oscillation wavelength, and a distributed feedback laser structure is preferable because it usually operates in a single longitudinal mode. In particular, it is more preferable that the active layer have a quantum well structure like the example as shown in FIG. 6 because this ensures the lower threshold operation based on quantized levels with preventing the chirping. In this case, the grating spacing of the distributed Bragg reflector 13 is determined of its own accord by the oscillation wavelength, and the length of the reflector 13 is selected such that a desired reflectivity is obtained. Alternatively, an integration structure analogous to that of FIG. 7 can be implemented using the gain-switched semiconductor laser in place of the Q-switched semiconductor laser.

Figure 8:
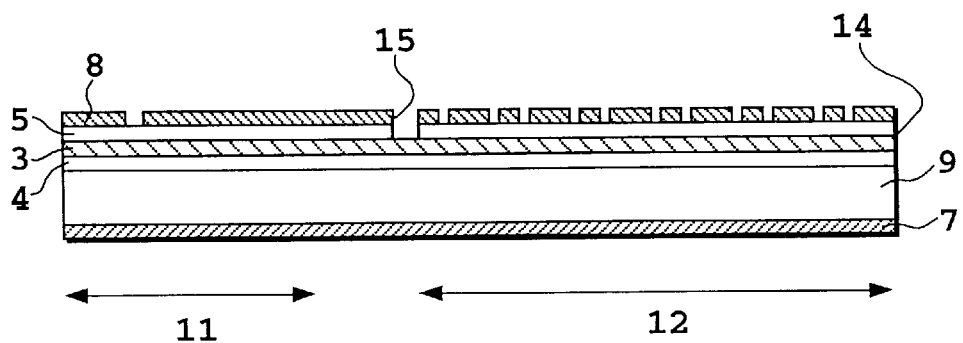
FIG. 8 is a cross-sectional view showing an example comprising a semiconductor laser optical pulse source using an air gap reflector formed by etching and the semiconductor optical pulse compression waveguide in accordance with the present invention, both of which are integrated into the same substrate.

FIG. 8 shows another example of a composite device integrating the Q-switched semiconductor laser and the semiconductor optical pulse compression waveguide in accordance with the present invention. In this example, the resonator of the semiconductor laser is composed of a left end face and an air gap reflector 15. A right side optical outlet end face 14 is covered with an antireflection coating so that the end face does not function as an external reflector of the Q-switched semiconductor laser 11. The air gap reflector 15 includes a gap (very fine groove) reaching under the active layer (active region) formed by finely etching the semiconductor layer, and utilizes its side wall as the reflector. Such a gap (very fine groove) can be formed by etching the semiconductor layer using a method such as dry etching process that carries out etching by generating a reactive plasma beam. The Q-switched semiconductor laser 11 with a distributed feedback structure is preferable because it usually operate in the single longitudinal mode. In particular, the active layer with the quantum well structure as shown in FIG. 6 is more preferable because it can be made highly efficient because of the quantized levels and can also prevent chirping. In addition, an integration structure analogous to that as shown in FIG. 8 can be implemented using the gain-switched semiconductor laser instead of the Q-switched semiconductor laser.

Figure 9:
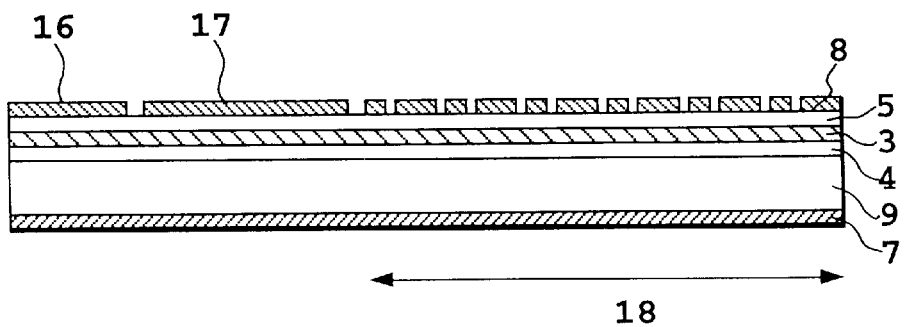
FIG. 9 is a cross-sectional view showing an example of a semiconductor optical pulse generating laser with an optical pulse compression waveguide formed by integrating the semiconductor optical pulse compression waveguide in accordance with the present invention into the resonator of a Q-switched semiconductor laser.

FIG. 9 shows an example of a semiconductor optical pulse generating laser with an optical pulse compression waveguide, which is formed by integrating into a semiconductor laser resonator a Q-switched semiconductor laser region together with a semiconductor optical pulse compression waveguide region. The operation principle of generating the optical pulse by the semiconductor optical pulse generating laser is based on the fact that a sudden (pulse-like) change in the voltage applied to a left end saturable absorption region, that is, a Q-switching absorption modulation region 16 varies the loss of the resonator, a result of which causes instantaneous laser oscillation. Integrating the semiconductor optical pulse compression waveguide region into the resonator of the semiconductor laser as shown in FIG. 9 can reduce the width of the optical pulse directly generated by the Q-switched semiconductor laser region. In the example as shown in FIG. 9, the resonator of the semiconductor laser utilizes the left end face and the right end face as reflectors at both ends. The optical outlet end face (right end face) can have such a structure as not covered with an antireflection coating so that the end face causes a low level reflection in the semiconductor optical pulse compression waveguide region. It is preferable to employ a distributed Bragg reflector as the reflector of the Q-switched semiconductor laser because this makes it possible to control the operation wavelength. In particular, the active layer with the quantum well structure as in the example shown in FIG. 6 can not only ensure highly efficient operation based on the quantized levels, but also prevent chirping, which is more preferable in this case.

The present invention has been described in detail with respect to preferred embodiments, and it will now be more apparent from the foregoing to those skilled in the art that changes and modifications may be made without departing from the invention in its broader aspect, and it is the invention, therefore, in the apparent claims to cover all such changes and modifications as fall within the true spirit of the invention.

What is claimed is:

1. A semiconductor optical pulse compression waveguide composed of a semiconductor optical waveguide that guides an optical signal and includes an optical pulse compression region, said optical pulse compression region comprising:
    at least one saturable amplifier region (1) that loses its amplification characteristic after amplifying a fixed amount of optical energy; and
    at least one saturable absorber region (2) that loses its absorption characteristic after absorbing a fixed amount of optical energy,
    wherein said at least one saturable amplifier region (1) and said at least one saturable absorber region (2) are disposed alternately in series in said optical compression region.

2. The semiconductor optical pulse compression waveguide as claimed in claim 1, further comprising a first light modulation region disposed between an optical pulse inlet, through which the optical signal is injected into the optical waveguide, and said optical pulse compression region, for regulating energy of an optical pulse.

3. The semiconductor optical pulse compression waveguide as claimed in claim 1, further comprising a second light modulation region disposed between said optical pulse compression region and an optical pulse outlet, through which the optical signal is extracted from the optical waveguide, for regulating energy of an optical pulse.

4. The semiconductor optical pulse compression waveguide as claimed in claim 2, further comprising a second light modulation region disposed between said optical pulse compression region and an optical pulse outlet, through which the optical signal is extracted from the optical waveguide, for regulating energy of the optical pulse.

5. A semiconductor optical pulse generating laser with an optical pulse compression waveguide, composed of a semiconductor laser for generating an optical pulse and an optical pulse compression waveguide region included in a resonator of the semiconductor laser, said optical pulse compression region comprising:
    at least one saturable amplifier region (1) that loses its amplification characteristic after amplifying a fixed amount of optical energy; and
    at least one saturable absorber region (2) that loses its absorption characteristic after absorbing a fixed amount of optical energy,
    wherein said at least one saturable amplifier region (1) and said at least one saturable absorber region (2) are disposed alternately in series in said optical pulse compression region, and said semiconductor laser has a function to generate an optical pulse using one of Q-switching, gain switching and mode locking techniques.

* * * * *

UNITED STATES PATENT AND TRADEMARK OFFICE
CERTIFICATE OF CORRECTION

PATENT NO. : 6,356,693 B1
DATED : March 12, 2002
INVENTOR(S) : Mitsuaki Shimizu and Yoshihiro Suzuki It is certified that error appears in the above-identified patent and that said Letters Patent is hereby corrected as shown below:

Column 1,
Line 59, after "generally" change "grow" to -- grows --

Column 2,
Line 60, after "a few" change "centimeter" to -- centimeters --

Column 6,
Line 46, after "actual" change "condition" to -- conditions --
Line 57, after "gain of" change "th" to -- the --

Column 7,
Line 22, after "In other" change "word" to -- words --

Column 13,
Line 25, after "usually" change "operate" to -- operates --

Signed and Sealed this

Seventh Day of September, 2004

JON W. DUDAS
*Director of the United States Patent and Trademark Office*